United States Patent
Song

(10) Patent No.: US 7,592,828 B2
(45) Date of Patent: Sep. 22, 2009

(54) METHOD AND DEVICE OF MEASURING INTERFACE TRAP DENSITY IN SEMICONDUCTOR DEVICE

(75) Inventor: Jong Kyu Song, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 365 days.

(21) Appl. No.: 11/646,806

(22) Filed: Dec. 27, 2006

(65) Prior Publication Data

US 2007/0152673 A1      Jul. 5, 2007

(30) Foreign Application Priority Data

Dec. 30, 2005   (KR)   .................... 10-2005-0134764

(51) Int. Cl.
*G01R 31/28* (2006.01)
*H01L 21/66* (2006.01)
*G06F 19/00* (2006.01)

(52) U.S. Cl. .................... 324/765; 438/17; 702/117

(58) Field of Classification Search ................ 324/765, 324/766; 438/14, 17; 702/81, 117
See application file for complete search history.

(56) References Cited

U.S. PATENT DOCUMENTS

| 5,140,272 | A  | * | 8/1992 | Nishimatsu et al. | ......... 324/662 |
| 6,844,604 | B2 | * | 1/2005 | Lee et al. | .................... 257/410 |
| 6,894,517 | B2 | * | 5/2005 | Kang et al. | ................. 324/765 |

* cited by examiner

*Primary Examiner*—Ernest F Karlsen
(74) *Attorney, Agent, or Firm*—The Law Offices of Andrew D. Fortney; Andrew D. Fortney

(57) ABSTRACT

A method is provided for measuring interface trap density in a semiconductor device. In the method, measurement parameters are input to a host computer. A pulse condition is set at a pulse generator using the measurement parameters. A pulse of a predetermined frequency generated by the pulse generator is applied to a gate of a transistor, and a charge pumping current is measured from a bulk of the transistor. A charge pumping current measurement may be repeated for a plurality of frequencies while changing the frequency until a set frequency is reached. A pure charge pumping current is calculated for each frequency where a gate tunneling leakage current is removed from the charge pumping current measured for each frequency. Interface trap density is calculated from the calculated pure charge pumping current for each frequency.

10 Claims, 3 Drawing Sheets

METHOD AND DEVICE OF MEASURING INTERFACE TRAP DENSITY IN SEMICONDUCTOR DEVICE

BACKGROUND OF THE INVENTION

1. Field of the Invention

The present invention relates to a method and device for measuring interface trap density in a semiconductor device.

2. Description of the Related Art

As a semiconductor technology develops constantly, the length of gates gradually become shorter and the thickness of gate oxide layers gradually become thinner. Accordingly, characteristics of semiconductor devices are inevitably affected by these smaller dimensions. One of the characteristics affected is the interface trap density between a silicon substrate and a gate oxide layer.

Generally, when a gate oxide layer is grown, a sufficient bonding is not made between a silicon atom and an oxygen atom, so that a dangling bond (where there are insufficient oxygen atoms) is generated at an interface between a silicon substrate and the gate oxide layer.

A dangling bond easily attracts an electron when a transistor operates, thereby increasing the interface trap density of the gate oxide layer. Accordingly, the quality of the gate oxide layer deteriorates or the driving current is reduced, which may degrade some characteristics of a semiconductor device.

Traditionally, a charge pumping test has been used as a method for measuring a surface state located under a gate oxide layer. The interface trap density may be calculated from data obtained using this test. However, when the conventional method is applied to a device having a very thin gate oxide layer, gate tunneling leakage current and/or quantum mechanical effects can result in an incorrect calculation of the interface trap density (generally resulting in a calculated interface trap density that is too high).

SUMMARY OF THE INVENTION

Accordingly, the present invention is directed to a method and device for measuring interface trap density in a semiconductor device that substantially obviates one or more problems due to limitations and disadvantages of the related art.

An object of the present invention is to more accurately measure and calculate interface trap density in a semiconductor device having a thin gate oxide layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for measuring interface trap density, the method including: inputting measurement parameters to a host computer; setting a pulse condition at a pulse generator using the measurement parameters; applying a pulse of a predetermined frequency generated by the pulse generator to a gate of a transistor; measuring a charge pumping current from a bulk of the transistor; repeating a charge pumping current measurement for a plurality of frequencies while changing a frequency until a set frequency is reached; calculating a pure charge pumping current for each frequency where a gate tunneling leakage current is removed from the charge pumping current measured for each frequency; and calculating interface trap density from the calculated pure charge pumping current for each frequency.

Also, there is provided a device for measuring interface trap density, the device including: a host computer to input measurement parameters; a pulse generator to generate a pulse of a predetermined frequency by using the measurement parameters, wherein the pulse is applied to an object wafer; and an amperemeter to measure a charge pumping current from the object wafer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
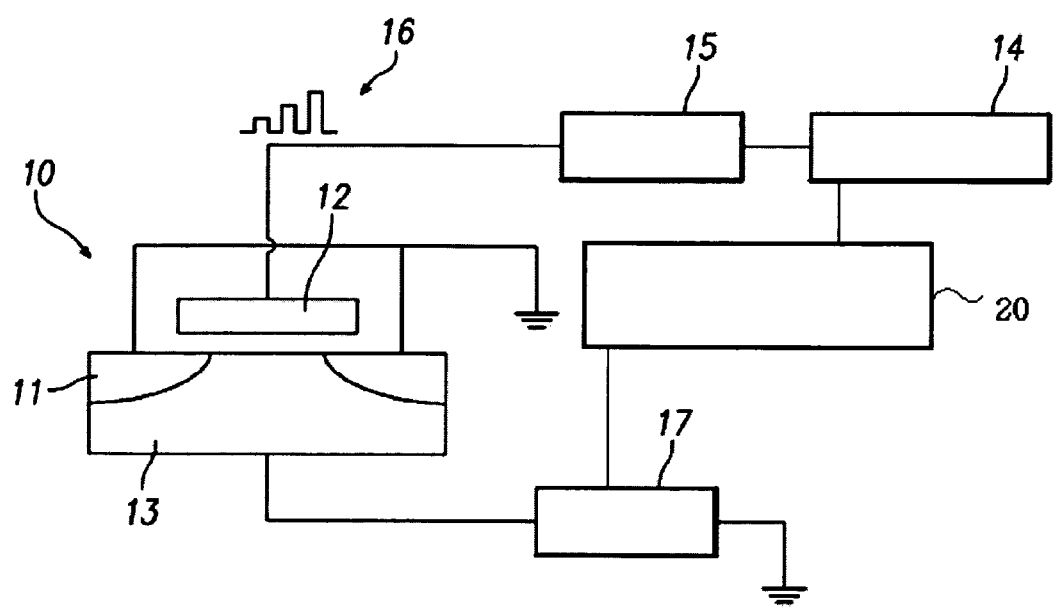
FIG. 1 is a view illustrating an apparatus for measuring a charge pumping current according to an embodiment of the present invention.

FIG. 1 is a view illustrating a construction of an apparatus for measuring a charge pumping current according to an embodiment of the present invention.

Referring to FIG. 1, a pulse 16 having a fixed base voltage is applied to a gate 12 of a transistor in wafer 10, with source/drain 11 of the transistor grounded, and an amperemeter 17 in a measuring apparatus connected to a bulk 13 (also called a body or a base) of the transistor. Accordingly, a gate channel of the transistor operates between an accumulation state and an inversion state to generate the charge pumping current ($I_{cp}$) This current is measured from the bulk 13 (e.g. by amperemeter 17).

The pulse 16 has a fixed low level gate voltage (i.e., a base voltage) and an increasing high level gate voltage (i.e., a peak voltage). The pulse 16 is generated at a pulse generator 14 (e.g., HP8110A). A selector 15 (e.g., HP16440A) controls the pulse 16 generated at the pulse generator 14 and applies the pulse 16 for a predetermined time for measurement. That is, the selector 15 serves as a switch. Meanwhile, though not shown in the drawing, a probe station on which the wafer 10 is put, and a host computer responsible for an overall control are also parts of the measuring apparatus.

Hereinafter, a method for measuring interface trap density will be described.

First, measurement parameters may be input to the host computer. Examples of the measurement parameters include a width and a length of a gate (i.e., an area of a gate), a base voltage of a pulse, an initial peak voltage of a pulse, a final peak voltage of a pulse, a pulse frequency, and/or a pulse width. Pulse generator 14 may be configured with a pulse condition according to the measurement parameters as input to the host computer. In a preferred embodiment, the pulse condition includes a predetermined value of a pulse frequency.

The pulse 16 of the predetermined frequency is generated by the pulse generator 14. The selector 15 is operated to apply the pulse 16 of the predetermined frequency to the gate 12. After a charge pumping current $I_{cp}$ is measured from the bulk 13, the selector 15 is stopped. The measurement of a charge pumping current is repeatedly performed for each frequency. A pulse frequency to be measured may be set in advance (e.g., by configuring the measurement parameters). In one embodiment, the measurement of a charge pumping current may be repeated while the pulse frequency is changed until a set frequency is reached. Measurement values of a charge pumping current may be obtained for a plurality of frequencies in this manner.

The measured charge pumping current value generally includes a gate tunneling leakage current. Therefore, a "pure" charge pumping current for each frequency may be calculated according to Equation 1 below.

$$I_{cp}(f_2)-I_{cp}(f_1)=[I_{cp0}(f_2)+I_{tunneling}]-[I_{cp0}(f_1)+I_{tunneling}]=I_{cp0}(f_2-f_1),$$ Equation 1 where $I_{cp}(f_1)$ and $I_{cp}(f_2)$ are charge pumping currents measured for a first frequency and a second frequency, respectively, $I_{tunneling}$ is a leakage current, and $I_{cp0}(f_1)$ and $I_{cp0}(f_2)$ are pure charge pumping currents for the first and second frequencies, respectively, where an influence of a leakage current has been removed.

A pure charge pumping current is calculated by measuring charge pumping currents at two frequencies, respectively, and subtracting according to Equation 1. For example, a pure charge pumping current value at a frequency of 1 MHz (e.g., a where a tunneling current has been removed) may be obtained by subtracting a charge pumping current value measured at a frequency of 1 MHz from a charge pumping current value measured at a frequency of 2 MHz. The reason this calculation Equation 1 is possible is that a charge pumping current is in proportion to a frequency, while the tunneling current is generally constant.

Figure 2:
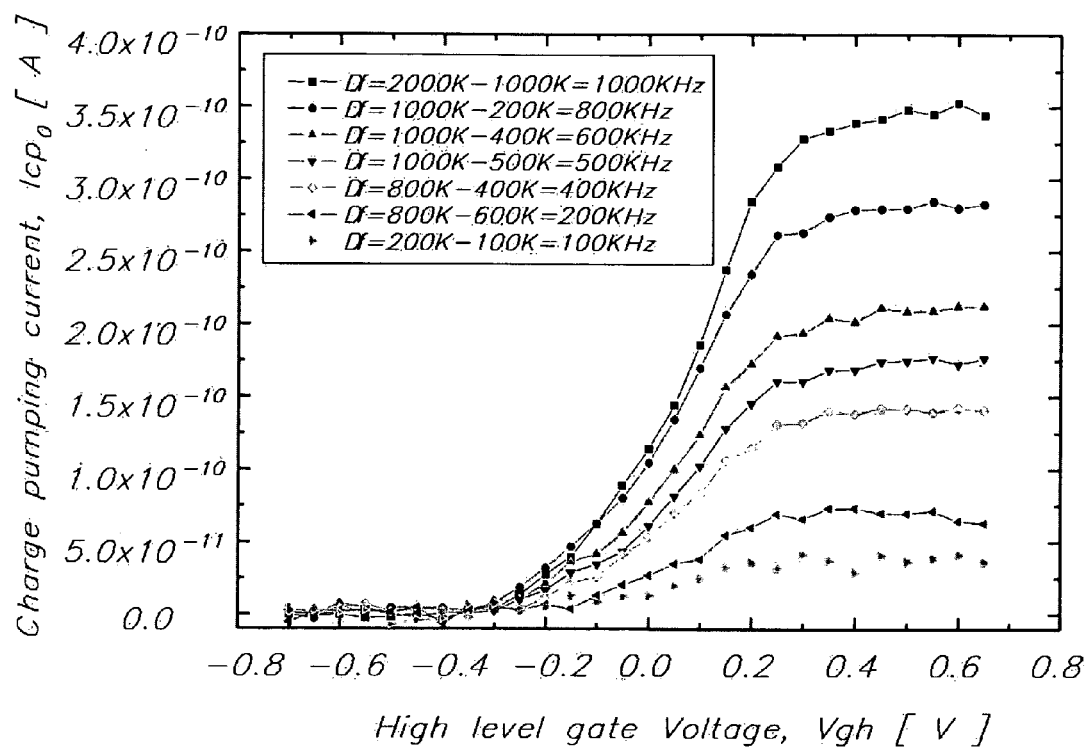
FIG. 2 is a graph illustrating a charge pumping current versus a high level gate voltage for each frequency according to an embodiment of the present invention.

Charge pumping currents for each frequency calculated in this manner are illustrated in FIG. 2.

FIG. 2 is a graph illustrating a charge pumping current versus a high level gate voltage for a plurality of frequencies according to an embodiment of the present invention.

The interface trap density may be calculated from the "pure" charge pumping current according to Equation 2 below.

$$N_{it} = \frac{I_{cp}}{f \times A_g \times q},$$ Equation 2 where $N_{it}$ is the interface trap density, $I_{cp}$ is the calculated pure charge pumping current, f is the frequency at which the charge pumping current was measured, $A_g$ is an area of a gate, and q is an amount of charge.

Figure 3:
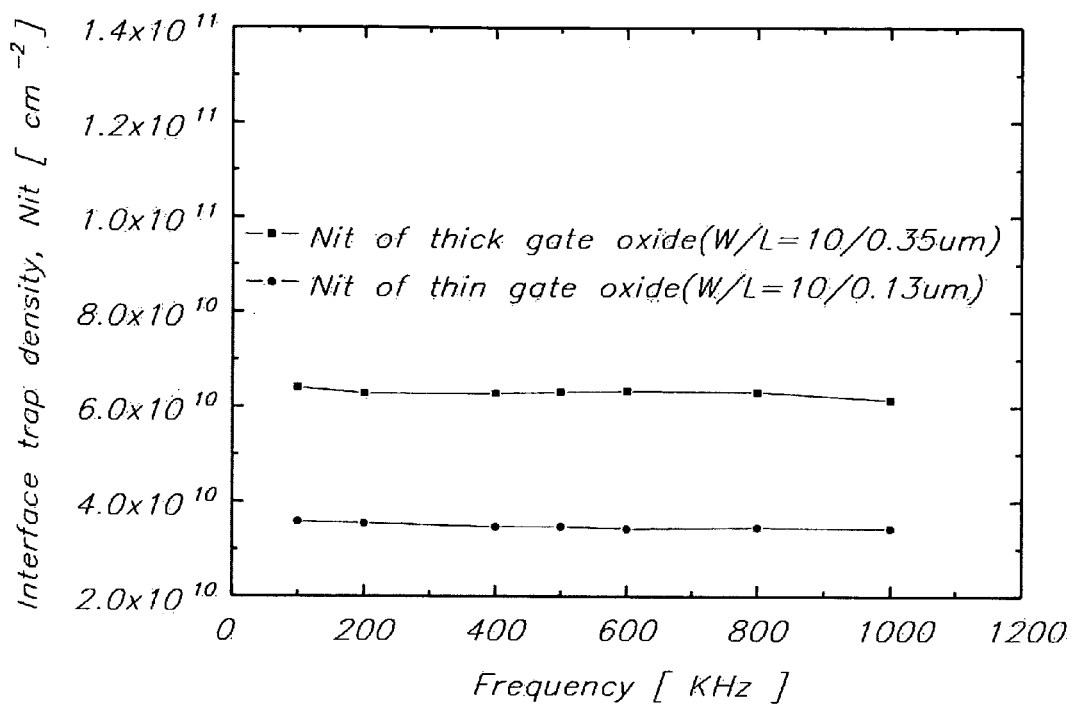
FIG. 3 is a graph illustrating interface trap density versus a pulse frequency according to an embodiment of the present invention.

FIG. 3 illustrates interface trap densities calculating according to Equation 2 for a plurality of frequencies.

FIG. 3 demonstrates that the interface trap density calculated according the present invention is generally constant even when the pulse frequency changes. In contrast, when conventional measuring methods are applied to a transistor with a thin gate oxide layer, the calculated interface trap density may erroneously increase as the frequency decreases. In some cases, measurement of the interface trap density for transistors with thing gate oxide films may be impossible. On the other hand, the present invention can obtain an accurate result value regardless of the pulse frequency as illustrated in FIG. 3.

As described above, the present invention can obtain accurate data of high reliability when measuring and calculating interface trap density in a semiconductor device having a thin gate oxide layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for measuring interface trap density, the method comprising:
    applying a pulse of a predetermined frequency generated by a pulse generator to a gate of a transistor;
    measuring a charge pumping current from a bulk of the transistor;
    calculating a pure charge pumping current for the predetermined frequency where a gate tunneling leakage current is removed from the charge pumping current measured for the predetermined frequency; and
    calculating interface trap density from the calculated pure charge pumping current for the predetermined frequency.

2. The method of claim 1, further comprising repeating the steps of applying a pulse, measuring a charge pumping current, calculating a pure charge pumping current, and calculating interface trap density for a plurality of predetermined frequencies.

3. The method of claim 2, wherein said repeating comprises changing said predetermined frequency until a set frequency is reached.

4. The method of claim 1, further comprising inputting measurement parameters to a host computer.

5. The method of claim 4, further comprising setting a pulse condition at the pulse generator using the measurement parameters.

6. The method according to claim 5, wherein the measurement parameters include a width and a length of a gate, a base voltage of a pulse, an initial peak voltage of a pulse, a final peak voltage of a pulse, a pulse frequency, and a pulse width.

7. The method according to claim 5, wherein the pulse condition includes a predetermined value of a pulse frequency.

8. The method according to claim 1, wherein the calculating of the pure charge pumping current for the predetermined frequency is performed using the Equation:

$$I_{cp}(f_2)-I_{cp}(f_1)=[I_{cp0}(f_2)+I_{tunneling}]-[I_{cp0}(f_1)+I_{tunneling}]=I_{cp0}(f_2-f_1),$$

where $I_{cp}(f_1)$ and $I_{cp}(f_2)$ are charge pumping currents measured by the predetermined frequency and a second frequency, respectively, $I_{tunneling}$ is a leakage current, $I_{cp0}(f_1)$ and $I_{cp0}(f_2)$ are pure charge pumping currents for the predetermined frequency and the second frequency, respectively, where an influence of the leakage current has been removed.

9. The method according to claim 1, wherein the calculating of interface trap density is performed using the Equation:

$$N_{it} = \frac{I_{cp}}{f \times A_g \times q},$$

where $N_{it}$ is the interface trap density, $I_{cp}$ is the calculated pure charge pumping current, f is the predetermined frequency, $A_g$ is an area of the gate, and q is an amount of charge.

10. The method according to claim 1, wherein the gate comprises a thin gate oxide layer.

\* \* \* \* \*